(12) United States Patent
You et al.

(10) Patent No.: US 9,653,481 B2
(45) Date of Patent: May 16, 2017

(54) FLEXIBLE DISPLAY HAVING DAMAGE IMPEDING LAYER AND METHOD FOR MANUFACTURING THE SAME

(71) Applicant: Samsung Display Co., Ltd., Yongin, Gyeonggi-Do (KR)

(72) Inventors: Suk-Beom You, Yongin (KR); Dae-Yong Kim, Yongin (KR); Joo-Hwa Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 40 days.

(21) Appl. No.: 14/293,947

(22) Filed: Jun. 2, 2014

(65) Prior Publication Data

US 2015/0042913 A1 Feb. 12, 2015

(30) Foreign Application Priority Data

Aug. 8, 2013 (KR) .................. 10-2013-0094272

(51) Int. Cl.
*H01L 27/12* (2006.01)
*H01L 51/00* (2006.01)
(Continued)

(52) U.S. Cl.
CPC ...... *H01L 27/1214* (2013.01); *H01L 27/1259* (2013.01); *H01L 27/3244* (2013.01);
(Continued)

(58) Field of Classification Search
CPC ............. H01L 27/1214; H01L 27/1218; H01L 27/1259; H01L 27/3244; H01L 51/0097;
(Continued)

(56) References Cited

U.S. PATENT DOCUMENTS

2003/0197197 A1* 10/2003 Brown ................ H01L 51/5246
257/200
2004/0046496 A1 3/2004 Mishima
(Continued)

FOREIGN PATENT DOCUMENTS

KR 10-2008-0004232 A 1/2008
KR 10-2009-0059457 A 6/2009
(Continued)

OTHER PUBLICATIONS

EP14180267.8, EP Search Report dated Feb. 13, 2015, (7 pgs).

*Primary Examiner* — Nathanael R Briggs
(74) *Attorney, Agent, or Firm* — Innovation Counsel LLP (57) ABSTRACT

A flexible display includes a flexible base substrate, a thin film transistors layer formed on the flexible base substrate, and a light emitting elements layer formed on the thin film transistors layer, where the flexible base substrate includes a first support layer formed below the thin film transistors layer, a second support layer disposed below the first support layer, and a heat-energy blocking/reflecting layer provided between the first support layer and the second support layer. The heat-energy blocking/reflecting layer is configured to block or reflect a sufficient portion of radiated heat-energy that is generated when the flexible base substrate is separated from a supporting carrier substrate so as to prevent the damage from the radiated heat-energy to the light emitting elements layer.

5 Claims, 6 Drawing Sheets (51) Int. Cl.
*H01L 27/32* (2006.01)
*H01L 51/56* (2006.01)
*H01L 51/52* (2006.01)

(52) U.S. Cl.
CPC ...... *H01L 51/0097* (2013.01); *H01L 51/5256* (2013.01); *H01L 51/56* (2013.01); *H01L 2227/326* (2013.01); *H01L 2251/5338* (2013.01); *Y02E 10/549* (2013.01); *Y02P 70/521* (2015.11)

(58) Field of Classification Search
CPC ................ H01L 51/5256; H01L 51/56; H01L 2227/326; H01L 2251/5338; G02F 1/133305; Y02P 70/521; Y02E 10/549
See application file for complete search history.

(56) References Cited

U.S. PATENT DOCUMENTS

| | | | |
|---|---|---|---|
| 2010/0062234 A1* | 3/2010 | Murashige | G02F 1/133305 428/213 |
| 2011/0032223 A1 | 2/2011 | Okamoto et al. | |
| 2012/0007083 A1* | 1/2012 | You | H01L 27/326 257/59 |
| 2012/0187399 A1* | 7/2012 | Fukuda | H01L 29/78603 257/43 |

FOREIGN PATENT DOCUMENTS

| | | |
|---|---|---|
| KR | 10-2012-0077473 A | 7/2012 |
| WO | 2005064993 A1 | 7/2005 |

\* cited by examiner

FLEXIBLE DISPLAY HAVING DAMAGE IMPEDING LAYER AND METHOD FOR MANUFACTURING THE SAME

CROSS-REFERENCE TO RELATED APPLICATION

This application claims priority to and the benefit of Korean Patent Application No. 10-2013-0094272 filed in the Korean Intellectual Property Office on Aug. 8, 2013, the entire contents of which application are incorporated herein by reference.

BACKGROUND (a) Field of Disclosure

The present disclosure relates to a flexible display and manufacture of the same.

(b) Description of Related Technology

A flexible display that is light and strong and that uses a flexible plastic substrate has been recently developed. Such a flexible display can be folded or rolled in a roll-to-roll manner so that portability of the flexible display can be maximized and accordingly it can be applied to various fields.

The flexible display includes a display element formed on a flexible substrate. A display element that can be used in the flexible display can be an organic light emitting diode (OLED) display element, a liquid crystal display element, an electrophoretic display (EPD) element, and the like.

The flexible display uses a flexible material so that it can maintain display performance even through it is bent like paper. However, during mass production fabrication, the flexible display is manufactured while being supported by and adhered to a rigid substrate, for example, a carrier substrate.

When a process of layering several layers on the in-process flexible display is finished, the adhesions of the flexible substrate to its rigid support carrier is broken by, for example irradiating from the bottom with laser beams to thereby separate the flexible display from the carrier substrate. In this process, a light emission layer or another photon absorbing layer of the flexible display may be damaged due to receiving part of the irradiation of the substrates separating laser beam.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

A flexible display device is provided with a damage preventing layer that can prevent damage to an overlying light emission elements layer during mass production manufacture, where the damage can be due to irradiation by laser beams used to separate the in-process flexible display device from a supporting carrier substrate during the manufacturing process.

A flexible display according to an exemplary embodiment includes a substrate, a thin film transistors layer formed on the substrate, and a light emitting elements layer formed on the thin film transistor, where the substrate layer includes a first support layer formed below the thin film transistors layer, a second support layer disposed below the first support layer, and a heat-energy blocking/reflecting layer provided between the first support layer and the second support layer.

The flexible display may further include an insulating layer formed at least between the first support layer and the reflective layer or between the reflective layer and the second support layer.

The first and/or second insulating layer may be made of a silicon oxide (SiOx) or a silicon nitride (SiNx).

The heat-energy blocking/reflecting layer may be made of an IR light reflecting metal.

The reflective layer may be predominantly composed of at least one of aluminum (Al), chromium (Cr), and molybdenum (Mo).

The first support layer and the second support layer may be made of a polyimide.

The light emitting elements layer may be one of an organic light emitting elements layer, a liquid crystal display elements layer, and an electrophoretic display elements layer.

The flexible display according to the exemplary embodiment can prevent damage to the light emitting elements layer due to irradiation of laser beams in a manufacturing process, and can further, in one embodiment, effectively prevent or impede permeation therethrough of moisture or oxygen into the light emitting element after separation from the carrier substrate.

DETAILED DESCRIPTION

In the following detailed description, only certain exemplary embodiments in accordance with the present disclosure of invention have been shown and described, simply by way of illustration. As those skilled in the art would realize in light of this disclosure, the described embodiments may be modified in various different ways, all without departing from the spirit or scope of the present teachings. The drawings and description are to be regarded as illustrative in nature and not restrictive. Like reference numerals designate like elements throughout the specification.

The size and thickness of the components shown in the drawings are optionally determined for better understanding and ease of description, and the present disclosure is not limited to the examples shown in the drawings.

In the drawings, the thickness of layers, films, panels, regions, etc., are exaggerated for clarity. In addition, in the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, it will be understood that when an element such as a layer, film, region, or substrate is referred to as being "on" another element, it can be directly on the other element or intervening elements may also be present.

Figure 4:
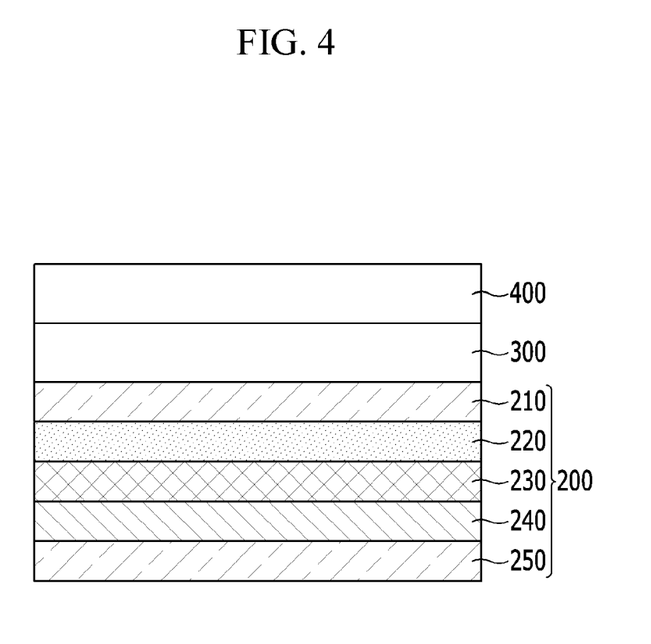
FIG. 4 is partially enlarged cross-sectional view of a part (i.e., a substrate) of the flexible display of FIG. 3.
Figure 5:
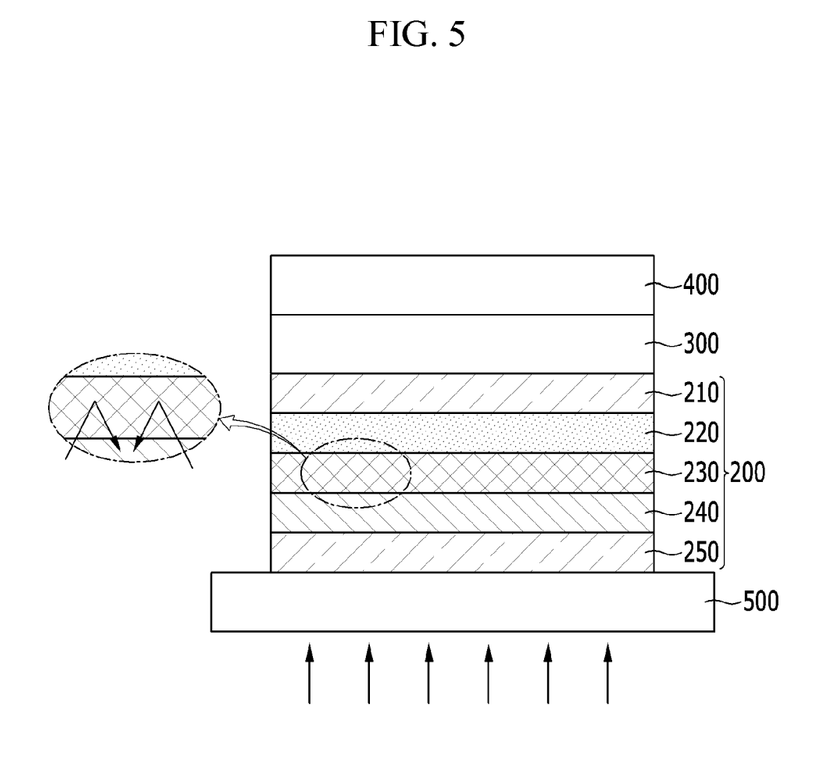
FIG. 5 and FIG. 6 show a process of separation of the flexible display according to the exemplary embodiment from the carrier substrate.
Figure 6:
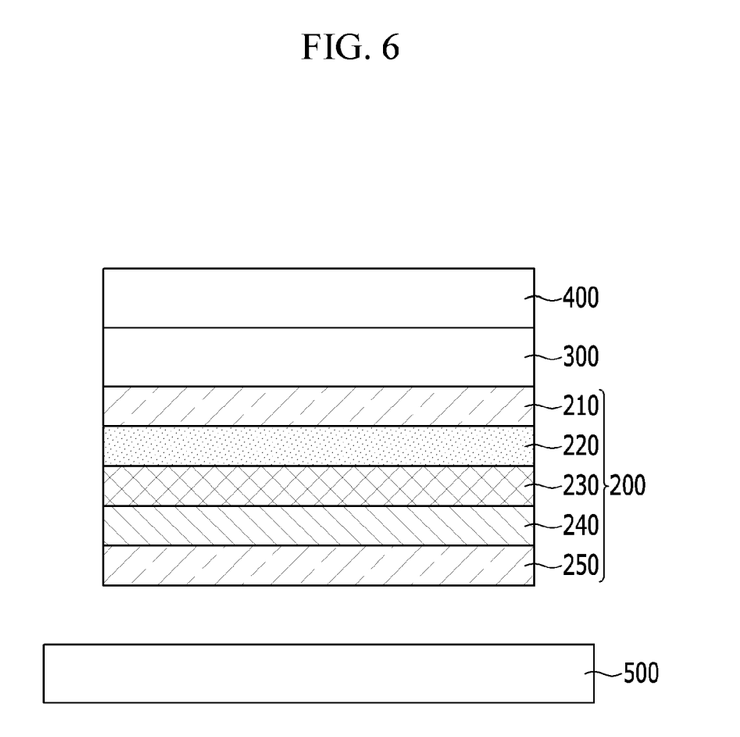

Referring to FIG. 4 to FIG. 6, a flexible display according to an exemplary embodiment has a structure that can prevent or reduce likelihood of damage to an irradiation sensitive layer, for example to an organic light emitting elements layer 400 due to the use of laser beams for separation of in-process layers of the flexible display form a supporting carrier substrate (e.g., 500 of FIG. 5). The exemplary flexible display includes a flexible substrate 200, a thin film transistor layer 300, and the organic light emitting elements layer 400.

The substrate 200 includes a first support layer 210, a second support layer 250, and a photons blocking and/or reflective layer 230 (e.g., IR block/reflect layer 230). Details of the substrate 200 will be described in detail later.

First, referring to FIG. 1 to FIG. 3, an overview of the structure of the flexible display according to the exemplary embodiment will be described.

Figure 1:
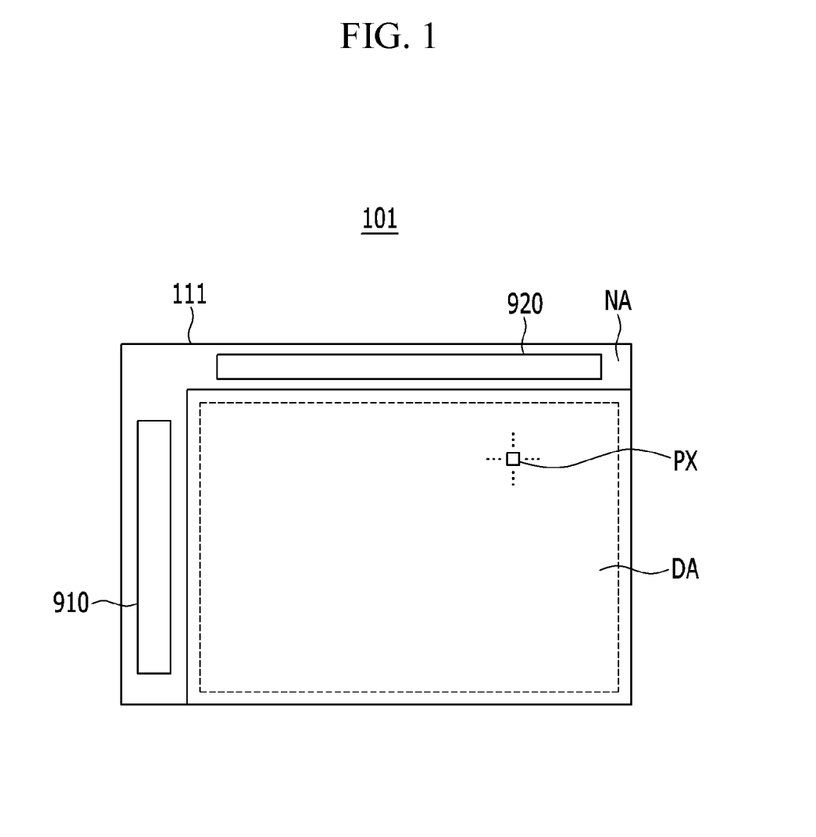
FIG. 1 is a top plan view of a structure of a flexible display according to an exemplary embodiment.

Referring to the top plan view of FIG. 1, a flexible display 101 according to the exemplary embodiment includes a substrate main body 111 divided into an image displaying area DA and a non-displaying area NA. Here, the flexible display 101 will be exemplarily illustrated as an organic light emission display formed of organic light emitting elements populating the display area (DA). However, the light emitting element of the flexible display is not limited thereto, and a liquid crystal display element (e.g., a reflective kind), an electrophoretic display element, and the like may be used instead.

A plurality of pixel areas PX are formed in the display area DA of the substrate main body 111 to display an image, and one or more driving circuits 910 and 920 are formed in the non-display area NA. Here, the pixel area PX refers to an area where a pixel which is a minimum unit for displaying a colored image is formed. However, in the exemplary embodiment, it is not necessary to form both the driving circuits 910 and 920 in the non-display area NA, and the driving circuits 910 and 920 may be partially or entirely omitted.

Figure 2:
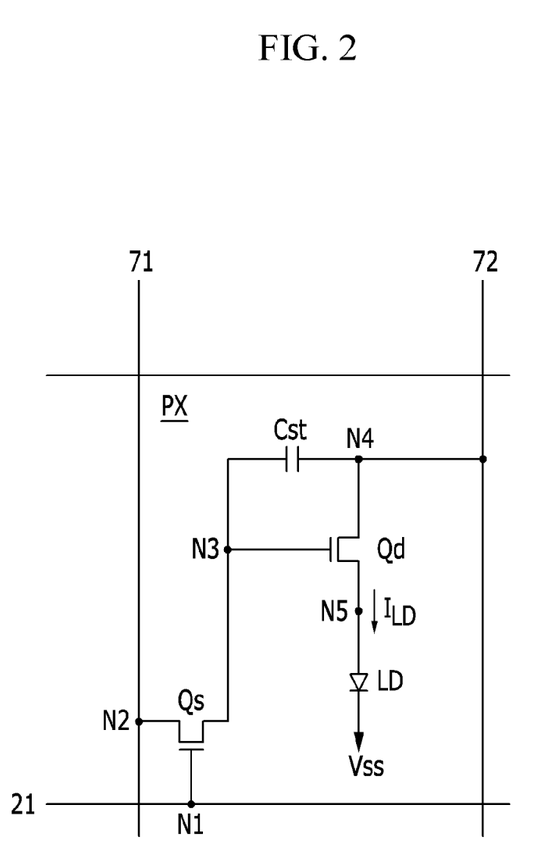
FIG. 2 is a circuit diagram of a pixel circuit of the flexible display of FIG. 1.

Referring to FIG. 2, the flexible display 101 according to the exemplary embodiment includes a plurality of signal lines 21, 71, and 72 and pixels PX connected to the signal lines 21, 71, and 72. Each pixel or included-therein subpixel PX may be one of a red pixel (R), a green pixel (G), a blue pixel (B) and/or a white (W) pixel.

The signal lines include scan lines 21 transmitting gate signals (or scan signals), data lines 71 transmitting data signals, and driving voltage lines 72 transmitting driving voltages. The scan signal lines 21 are substantially extended in a row direction and almost parallel with each other, and the data lines 71 are substantially extended in a column direction and almost parallel with each other. The driving voltage lines 72 are substantially extended in the column direction, but they may be formed in a net shape rather than being extended in just one of the row or column direction.

Each pixel PX includes a switching transistor Qs, a driving transistor Qd, a storage capacitor Cst, and an organic light emitting element LD.

The switching transistor Qs includes a control terminal N1, an input terminal N2, and an output terminal N3. The control terminal N1 is connected to the scan signal line 21, the input terminal N2 is connected to the data line 71, and the output terminal N3 is connected to the driving transistor Qd. The switching transistor Qs transmits a data signal received from the data line 71 in response to the scan signal received from the scan signal line 21 to the driving transistor Qd.

The driving transistor Qd includes a control terminal N3, an input terminal N4, and an output terminal N5, and the control terminal N3 is connected to the switching transistor Qs, the input terminal N4 is connected to the driving voltage line 72, and the output terminal N5 is connected to the organic light emitting element LD. The driving transistor Qd outputs an output current $I_{LD}$ whose magnitude varies according to a voltage applied between the control terminal N3 and the input terminal N4.

The capacitor Cst is connected between the control terminal N3 and the input terminal N4 of the driving transistor Qd. The capacitor Cst charges a data signal applied to the control terminal N3 of the driving transistor Qd and maintains charging of the data signal after the switching transistor Qs is turned off.

The organic light emitting element LD is, for example, an organic light emitting diode (OLED), and includes an anode connected to the output terminal N5 of the driving transistor Qd and a cathode connected to a common voltage VSS. The organic light emitting element LD emits light by varying an intensity according to the output current $I_{LD}$ of the driving transistor Qd to display an image. The organic light emitting element LD may include an organic material which uniquely expresses any one or one or more of primary colors such as three primary colors of red, green, and blue, and the organic light emitting diode display displays a desired image by a spatial and/or temporal sum of the output colors.

The switching transistor Qs and the driving transistor Qd are n-channel field effect transistors (FET), but at least one thereof may be a p-channel field effect transistor. Further, a connection relationship of the transistors Qs and Qd, the storage capacitor Cst, and the organic light emitting element LD may be changed.

Such a configuration of the pixel area PX is not limited to the above, and can be variously modified within the scope that can be easily modified by a person skilled in the art.

Next, referring to FIG. 3, the cross sectional structure of the flexible display according to the exemplary embodiment will be described according to a layering order. Here, the structure of the driving transistor Qd and the organic light emitting element LD will be mainly described in detail.

A substrate 123 is formed of a flexible substrate. The substrate 123 has flexibility such that it can be used in the flexible display, and this will be described in detail later.

A buffer layer 126 is formed on the substrate 123. The buffer layer 126 prevents permeation of an impurity (e.g., moisture and/or oxygen) and planarizes a surface.

In this case, the buffer layer 126 may be made of various materials that can perform the above-stated functions. For example, the buffer layer 126 may be formed of a single layer of one of a silicon nitride (SiNx), a silicon oxide (SiO$_x$), and a silicon oxynitride (SiOxNy). However, the buffer layer 126 may not be necessary, and may be omitted depending on the type and process conditions of the substrate 123.

A driving semiconductor layer 137 is formed on the buffer layer 126. The driving semiconductor layer 137 is formed of a polysilicon layer. In addition, the driving semiconductor layer 137 includes a channel area 135 in which impurities are not doped and a source area 134 and a drain area 136 in which impurities are doped at respective sides of the channel area. In this case, implanted ion materials may be used as the dopant impurities and these may be a P-type impurity like boron B, and $B_2H_6$ is used in general. Here, such an impurity is changed depending on the type of the thin film transistor being formed.

A gate insulating layer 127 formed of a silicon nitride (SiNx) or a silicon oxide ($SiO_x$) is formed on the driving semiconductor layer 137. Gate wires including a driving gate electrode 133 are formed on the gate insulating layer 127. In addition, the driving gate electrode 133 overlaps at least a part of the driving semiconductor layer 137. Particularly, the driving gate electrode 133 overlaps the channel area 135.

An interlayer insulating layer 128 that covers the driving gate electrode 133 is formed on the gate insulating layer 127. Through-holes that expose the source area 134 and the drain area 136 of the driving semiconductor layer 137 are respectively formed in the gate insulating layer 127 and the interlayer insulating layer 128. Like the gate insulating layer 127, the interlayer insulating layer 128 may be made of a ceramic-based material such as a silicon nitride (SiNx) or a silicon oxide ($SiO_x$).

Data wires including a driving source electrode 131 and a driving drain electrode 132 are formed on the interlayer insulating layer 128. In addition, the driving source electrode 131 and the driving drain electrode 132 are respectively connected with the source area 134 and the drain area 136 of the driving semiconductor layer 137 through the through-holes respectively formed in the interlayer insulating layer 128 and the gate insulating layer 127.

As described, the driving semiconductor layer 137, the driving gate electrode 133, the driving source electrode 131, and the driving drain electrode 132 form a driving thin film transistor 130. However, the configuration of the driving thin film transistor 130 is not limited to the above-stated example, and may have various known configurations that can be easily implemented by a person skilled in the art.

In addition, a planarization layer 124 covering the data wires is formed on the interlayer insulating layer 128. The planarization layer 124 removes a topographical step feature and planarizes a surface to improve light efficiency of an organic light emitting element to be formed thereon. In addition, the planarization layer 124 includes an electrode contact hole 122a that partially exposes the drain electrode 132.

The planarization layer 124 may be made of at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Here, the exemplary embodiment is not limited to the above-stated structure, and one of the planarization layer 124 and the interlayer insulating layer 128 may be omitted as necessary.

In this case, a first electrode of the organic light emitting element, that is, a pixel electrode 122b, is formed on the planarization layer 124. That is, the flexible display includes a plurality of pixel electrodes 122b provided in each of the plurality of pixels. In this case, the plurality of pixel electrodes 122b are separated from each other. Each pixel electrode 122b is connected with a respective drain electrode 132 through the corresponding electrode contact hole 122a of the planarization layer 124.

A pixel defining layer 125 having an opening that exposes the pixel electrode 122b is formed on the planarization layer 124. That is, the pixel defining layer 125 includes a plurality of openings formed in each pixel. An organic emission layer 122c may be formed in each opening formed within the pixel defining layer 125. Accordingly, a pixel area where an organic emission layer is formed may be defined by the pixel defining layer 125.

In this case, the pixel electrode 122b is disposed corresponding to the opening of the pixel defining layer 125, but this is not restrictive. That is, the pixel electrode 122b may be disposed below the pixel defining layer 125 such that a part of the pixel electrode 112b may be overlapped with the pixel defining layer 125.

The pixel defining layer 125 may be made of a resin such as a polyacrylate resin, a polyimide resin, and the like, or a silica-based inorganic material.

The organic emission layer 122c is formed on the pixel electrode 122b. The organic emission layer 122c may further include an emission layer (not shown) that substantially emits light in the visible range, and organic layers (not shown) for efficient transmission of carriers of holes or electrons to the emission layer. The organic layers may include a hole injection layer and a hole transport layer provided between the pixel electrode 122b and the emission layer and an electron injection layer and an electron transport layer provided between a common electrode 122d and the emission layer.

In addition, a second electrode, that is, the common electrode 122d, may be formed on the organic emission layer 122c. As described, the organic light emitting element LD including the pixel electrode 122b, the organic emission layer 122c, and the common electrode 122d is formed.

In this case, the pixel electrode 122b and the common electrode 122d may be respectively made of a transparent conductive material or a semi-transmissive or reflective conductive material. Depending of the type of material forming the pixel electrode 122b and the common electrode 122d, the flexible display may be a front emission type of display, a bottom emission type of display, or a dual-side emissive type of display.

An overcoat 190 that protects the common electrode 122d by covering the same may be formed as an organic layer on the common electrode 122d.

In addition, a thin film encapsulation layer 121 is formed on the overcoat 190. The thin film encapsulation layer 121 protects the organic light emitting element LD and the driving circuit formed in the substrate 123 by sealing them from the external environment.

The thin film encapsulation layer 121 includes organic encapsulation layers 121a and 121c and inorganic encapsulation layers 121b and 121d, and the organic encapsulation layers 121a and 121c and the inorganic encapsulation layers 121b and 121d are alternately layered. In FIG. 3, two organic encapsulation layers 121a and 121c and two inorganic encapsulation layers 121b and 121d are alternately layered to form the thin film encapsulation layer 121, but this is not restrictive.

Figure 3:
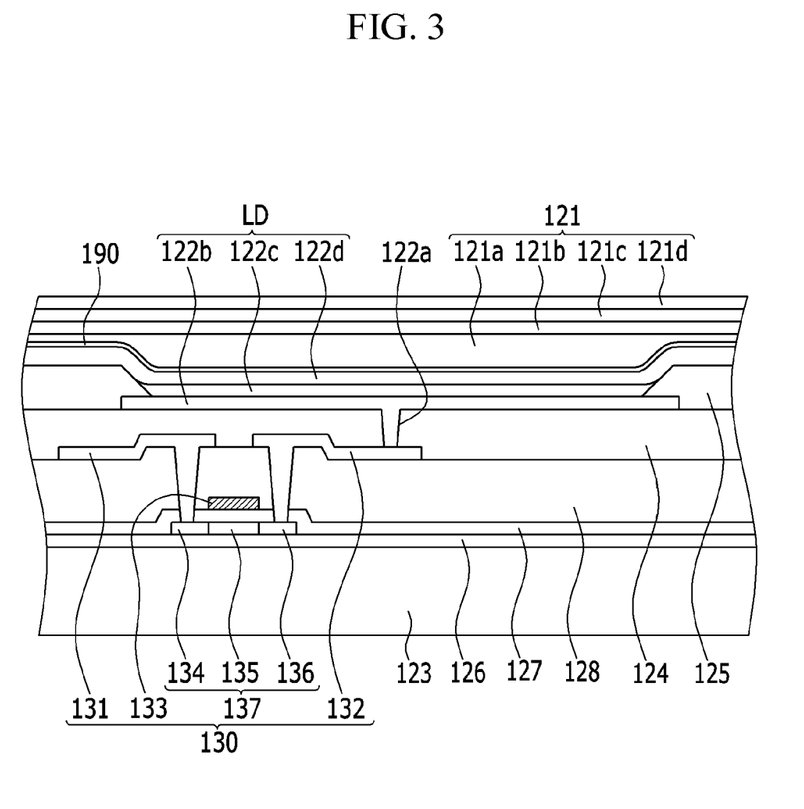
FIG. 3 is a partially enlarged cross-sectional view of a thin film transistor and a light emission element used in the flexible display of FIG. 1.

FIG. 4 is a schematic cross-sectional view of the flexible display of FIG. 3, and the substrate 200, the thin film transistor 300, and the organic light emitting element 400 are sequentially layered in the flexible display according to the exemplary embodiment. Here, the substrate 200, the thin film transistor 300, and the organic light emitting element 400 of FIG. 4 respectively correspond to the substrate 123, the driving thin film transistor 130, and the organic light emitting element LD of FIG. 3.

Referring to FIG. 4, the substrate 200 includes the first support layer 210, the second support layer 250, and the heat-energy blocking/reflecting layer 230.

In this case, the first support layer 210 and the second support layer 250 support the substrate 200, and form both side surfaces of the substrate 200. That is, as described above, the flexible substrate 200 is formed of dual support layers 210 and 250.

In this case, the first support layer 210 and the second support layer 250 may be made of a polyimide having flexibility and an excellent heat resisting characteristic among polymers instead of a rigid material. However, the material of the first and second support layers 210 and 250 is not limited thereto. Various materials having a flexible characteristic can be used.

The first support layer 210 may be formed below the thin film transistor 300, and the second support layer 250 may be disposed opposite to the first support layer 210 so as to have the heat-energy blocking/reflecting layer 230 interposed therebetween. The first support layer 210 and the second support layer 250 may be disposed at a distance from each other so as to interpose several layers therebetween.

Referring to FIG. 4 to FIG. 6, the heat-energy blocking/reflecting layer 230 is provided between the first support layer 210 and the second support layer 250. The heat-energy blocking/reflecting layer 230 blocks or reduces transmission of radiative heat energy (e.g., radiative energy in the InfraRed (IR) band of wavelengths) therethrough where the reflected and/or otherwise blocked heat-energy arises due to irradiation from below by laser beams applied to a lower portion of the carrier substrate 500 for the purpose of separating the carrier substrate 500 from the second support layer 250.

As shown in FIG. 5, the flexible display is manufactured by sequentially layering the substrate 200, the thin film transistor layer 300, and the organic light emitting elements layer 400 on a supporting carrier substrate 500 (e.g., a rigid carrier). Since the flexible display has flexibility, it is supported by a rigid substrate like that of the carrier substrate 500 during a manufacturing process.

Referring to FIG. 5 and FIG. 6, when a process of layering layers that form the flexible display on the carrier substrate 500 is finished, laser beams are irradiated to the lower portion of the carrier substrate 500 to break down an adhesion mechanism that binds the second support layer 250 with the carrier substrate 500 and to thereby separate the substrate 200 and the carrier substrate 500. In this case, radiative heat energy in the form of photons in the InfraRed (IR) band of wavelengths is generated from the use of the laser beams and this radiative heat energy is transmitted into the flexible display. However, certain layers within the overlying and in-process flexible display 200-300-400 may be damaged by the upwardly transmitted radiative heat energy, for example the organic light emitting elements layer 400 may be damaged and/or otherwise undesirably influenced by the transmitted heat energy.

However, because the heat-energy blocking/reflecting layer 230 is provided between the first support layer 210 and the second support layer 250 and is configured to block and/or reflect a sufficient amount of the heat energy to prevent irreversible damage to the organic light emitting elements layer 400 that might be caused by the heat energy.

Meanwhile, when formed of appropriate materials, the heat-energy blocking/reflecting layer 230 may additionally prevent or impede permeation therethrough of moisture or oxygen into the flexible display to thereby help improve the reliability and/or usable lifetime of the flexible display.

According to the exemplary embodiment, the reflective layer 230 may be made of an IR-reflecting and O2 impermeable metal film. The metallic heat-energy blocking/reflecting layer 230 can therefore reflect back the upwardly radiated heat energy that arises from the irradiation by the laser beam(s) in separating the second support layer 250 from the carrier substrate 500.

In this case, the metal forming the heat-energy blocking/reflecting layer 230 may be aluminum (Al), chromium (Cr), molybdenum (Mo), alloys thereof and the like. However, the metal forming the heat-energy blocking/reflecting layer 230 is not limited thereto, and various other metals having high reflectivity with respect to the spectrum of the radiated heat energy may be applicable.

Referring to FIG. 4, a first insulating layer 220 is formed between the first support layer 210 and the heat-energy blocking/reflecting layer 230. In addition, a second insulating layer 240 is formed between the heat-energy blocking/reflecting layer 230 and the second support layer 250.

In this case, the first insulating layer 220 and the second insulating layer 240 may be made of a silicon oxide (SiOx) or a silicon nitride (SiNx). However, a material forming the first and second support layers 210 and 250 is not limited thereto, and various known materials that form an insulating layer used in a display may be applicable. At least the first insulating layer 220 may be configured to impede thermal conduction therethrough.

At least one of the first insulating layer 220 and the second insulating layer 240 may be further configured to prevent permeation of undesired impurities into the organic light emitting elements layer 400. In further detail, the first insulating layer 220 and the second insulating layer 240 can block permeation of moisture or oxygen into the organic light emitting elements layer 400.

Thus, the flexible display according to the exemplary embodiment can further effectively block permeation of moisture or oxygen into the organic light emitting element 400 by at least one of the first insulating layer 220 and the second insulating layer 240 while the heat-energy blocking/reflecting layer 230 blocks and/or reflects a sufficient amount of the heat energy to prevent irreversible damage to layers above itself.

Meanwhile, according to another exemplary embodiment, the substrate 200 may include only one of the first insulating layer 220 and the second insulating layer 240. That is, the substrate 200 may include only the first insulating layer 220 disposed between the first support layer 210 and the reflective layer 230 or only the second insulating layer 240 disposed between the reflective layer 230 and the second support layer 250.

The flexible display according to the exemplary embodiment can prevent damage to the organic light emitting elements layer 400 due to irradiation of laser beams in a manufacturing process by inclusion of the heat-energy blocking/reflecting layer, the first insulating layer, and the second insulating layer in the substrate, and can simultaneously prevent or impede permeation of moisture or oxygen into the organic light emitting element.

It is to be noted that photon blocking patterns are sometimes included in LCD displays for the purpose of blocking passage of visible light photons from their backlighting systems into the switching transistors that may be affected by such photons in the visible light portion of the spectrum. However, the present disclosure contemplates the blockage and/or reflecting of photons in the InfraRed (IR) band of wavelengths and across substantially all portions of the display area, including those that constitute the light emitting and/or light valving aperture portions of the display area (DA) for the purpose of preventing or limiting irreversible damage to elements affected by such photons in the InfraRed (IR) band. It is also within the contemplation of the disclosure to block or reflect damaging photons in wavelength ranges above the visible range (above about 700 nm, such as in the low UV range).

While this disclosure of invention has been described in connection with what is presently considered to be practical exemplary embodiments, it is to be understood that the present teachings are not limited to the disclosed embodiments, but, on the contrary, they intended to cover various modifications and equivalent arrangements included within the spirit and scope of the present teachings.

What is claimed is:

1. A flexible display comprising a substrate, a thin film transistors layer formed on the substrate, and a light emitting or light passage controlling elements layer formed on the thin film transistors layer, wherein the substrate comprises:
   a first support layer formed below the film transistors layer;
   a second support layer as a single layer and disposed below the first support layer;
   a heat-energy blocking/reflecting layer formed as a single layer interposed between the first support layer and the second support layer;
   a first insulating layer formed as a single layer and interposed directly between the first support layer and the heat-energy blocking/reflecting layer; and
   a second insulating layer formed as a single layer and interposed directly between the heat-energy blocking/reflecting layer and the second support layer,
   wherein the first support layer and the second support layer are each made of a respective polyimide.

2. The flexible display of claim 1, wherein the at least one of the first and second insulating layers includes a silicon oxide (SiOx) or a silicon nitride (SiNx).

3. The flexible display of claim 1, wherein the heat-energy blocking/reflecting layer is made of a metal.

4. The flexible display of claim 3, wherein the heat-energy blocking/reflecting layer is predominantly made of at least one of aluminum (Al), chromium (Cr), and molybdenum (Mo).

5. The flexible display of claim 1, wherein the light emitting or light passage controlling elements layer is at least one of an organic light emitting elements layer, a liquid crystal display elements layer, and an electrophoretic display elements layer.

* * * * *